United States Patent
Woodward

(10) Patent No.: US 9,468,122 B2
(45) Date of Patent: Oct. 11, 2016

(54) PORTABLE DEVICE HOLDING APPARATUS

(71) Applicant: Ford Global Technologies, LLC, Dearborn, MI (US)

(72) Inventor: Ian Woodward, Monbulk (AU)

(73) Assignee: Ford Global Technologies, LLC, Dearborn, MI (US)

( * ) Notice: Subject to any disclaimer, the term of this patent is extended or adjusted under 35 U.S.C. 154(b) by 230 days.

(21) Appl. No.: 13/798,876

(22) Filed: Mar. 13, 2013

(65) Prior Publication Data

US 2014/0268509 A1    Sep. 18, 2014

(51) Int. Cl.
| | |
|---|---|
| *H05K 7/14* | (2006.01) |
| *B60R 11/02* | (2006.01) |
| *F16M 11/10* | (2006.01) |
| *F16M 11/20* | (2006.01) |
| *F16M 13/00* | (2006.01) |
| *F16M 13/02* | (2006.01) |
| *F21V 21/00* | (2006.01) |
| *B60R 11/00* | (2006.01) |

(52) U.S. Cl.
CPC ............. *H05K 7/14* (2013.01); *B60R 11/02* (2013.01); *F16M 11/105* (2013.01); *F16M 11/2021* (2013.01); *F16M 13/00* (2013.01); *F16M 13/022* (2013.01); *F21V 21/00* (2013.01); *B60R 2011/0005* (2013.01); *B60R 2011/0061* (2013.01); *B60R 2011/0071* (2013.01); *B60R 2011/0087* (2013.01)

(58) Field of Classification Search
None
See application file for complete search history.

(56) References Cited

U.S. PATENT DOCUMENTS

| | | | |
|---|---|---|---|
| 4,670,988 A | 6/1987 | Baxter | |
| 5,276,596 A | 1/1994 | Krenzel | |
| 5,779,205 A | 7/1998 | Ching | |
| 5,799,914 A | 9/1998 | Chivallier et al. | |
| 5,842,481 A | 12/1998 | King | |
| 5,988,572 A | 11/1999 | Chivallier et al. | |
| 6,042,414 A * | 3/2000 | Kunert | 439/374 |
| 6,062,518 A * | 5/2000 | Etue | 248/231.21 |
| 6,398,173 B1 * | 6/2002 | Sawayanagi | 248/200 |
| 6,417,786 B2 | 7/2002 | Learman et al. | |

(Continued)

FOREIGN PATENT DOCUMENTS

| | | |
|---|---|---|
| DE | 202011004924 U1 | 10/2011 |
| DE | 102010025563 A1 | 12/2011 |

(Continued)

OTHER PUBLICATIONS

"Top Cellet Vehicle Dash Phone Holder for Cell Phones & Smartphones," Rocky Case, 2 pages, Copyrighted 2013, www.rockycase.com.

(Continued)

*Primary Examiner* — Xanthia C Cunningham
(74) *Attorney, Agent, or Firm* — Vichit Chea; Price Heneveld LLP

(57) ABSTRACT

An apparatus for holding a portable device is provided which includes a cradle for holding the portable device. A support member is operatively coupled to the cradle and includes an inserting member. The inserting member may be received by a receiving member coupled to a base member, wherein the base member is mounted to a supporting surface. Once the receiving member receives the inserting member, at least one locking mechanism can releasably couple the support member to the base member for securing the apparatus to the surface.

19 Claims, 9 Drawing Sheets

(56) References Cited

U.S. PATENT DOCUMENTS

| | | |
|---|---|---|
| 6,524,240 B1 | 2/2003 | Thede |
| 6,539,358 B1 | 3/2003 | Coon et al. |
| 6,558,193 B2* | 5/2003 | Sawayanagi et al. ........ 439/545 |
| 6,633,482 B2 | 10/2003 | Rode |
| 7,062,300 B1 | 6/2006 | Kim |
| 7,140,586 B2* | 11/2006 | Seil et al. .................. 248/311.2 |
| 7,269,002 B1 | 9/2007 | Turner et al. |
| 7,413,155 B2 | 8/2008 | Seil et al. |
| 7,623,958 B1 | 11/2009 | Laverick et al. |
| 7,650,230 B1* | 1/2010 | Laverick et al. ............. 701/491 |
| 7,873,771 B2 | 1/2011 | Krueger et al. |
| 7,911,779 B1* | 3/2011 | Tarnoff .................... 361/679.43 |
| 7,930,004 B2 | 4/2011 | Seil et al. |
| 7,930,006 B2 | 4/2011 | Neu et al. |
| 7,931,505 B2 | 4/2011 | Howard et al. |
| 7,933,117 B2 | 4/2011 | Howarth et al. |
| 8,120,895 B2* | 2/2012 | Zeller et al. ............. 361/679.01 |
| 8,145,821 B2 | 3/2012 | Mead et al. |
| 8,172,293 B2 | 5/2012 | Lota et al. |
| 8,183,825 B2 | 5/2012 | Sa |
| 8,242,906 B2 | 8/2012 | Fawcett |
| 8,276,863 B2* | 10/2012 | Niwai et al. ................ 248/278.1 |
| 8,325,028 B2 | 12/2012 | Schofield et al. |
| 8,331,084 B2* | 12/2012 | Chung et al. ............ 361/679.34 |
| 8,376,595 B2 | 2/2013 | Higgins-Luthman |
| 8,385,074 B2* | 2/2013 | Karl et al. .................... 361/726 |
| 8,393,584 B2 | 3/2013 | Burns |
| 8,492,698 B2 | 7/2013 | Schofield et al. |
| 8,496,144 B2 | 7/2013 | Son |
| 8,550,529 B2* | 10/2013 | Clochard .................... 296/37.12 |
| 8,845,003 B2* | 9/2014 | Still et al. .................... 296/97.9 |
| 8,955,728 B2* | 2/2015 | Schultze .................... 224/413 |
| 2004/0023633 A1 | 2/2004 | Gordon |
| 2005/0014536 A1* | 1/2005 | Grady ........................... 455/573 |
| 2005/0045681 A1 | 3/2005 | Hancock et al. |
| 2006/0024107 A1* | 2/2006 | Lyman et al. ................. 400/88 |
| 2006/0052144 A1 | 3/2006 | Seil et al. |
| 2007/0018064 A1 | 1/2007 | Wang |
| 2007/0114974 A1* | 5/2007 | Grady ........................... 320/137 |
| 2007/0281619 A1 | 12/2007 | Chen |
| 2008/0019082 A1* | 1/2008 | Krieger et al. ................ 361/679 |
| 2008/0174136 A1* | 7/2008 | Welschholz et al. ...... 296/37.12 |
| 2009/0275362 A1 | 11/2009 | Tieman et al. |
| 2010/0078536 A1 | 4/2010 | Galvin |
| 2010/0277862 A1* | 11/2010 | Kim ......................... 361/679.41 |
| 2011/0121148 A1 | 5/2011 | Pernia |
| 2011/0163211 A1 | 7/2011 | Cicco |
| 2011/0255226 A1* | 10/2011 | Duncan Seil et al. ... 361/679.01 |
| 2011/0259789 A1 | 10/2011 | Fan |
| 2011/0263293 A1 | 10/2011 | Blake et al. |
| 2012/0002355 A1* | 1/2012 | Chen ........................ 361/679.01 |
| 2012/0018473 A1 | 1/2012 | Da Costa Pito et al. |
| 2012/0043235 A1* | 2/2012 | Klement ....................... 206/320 |
| 2012/0061983 A1 | 3/2012 | Seiller et al. |
| 2012/0222935 A1* | 9/2012 | MacKay et al. ............... 194/210 |
| 2012/0236479 A1* | 9/2012 | Tamai et al. ............. 361/679.01 |
| 2012/0292463 A1* | 11/2012 | Burns ........................ 248/125.8 |
| 2012/0318796 A1 | 12/2012 | Doll |
| 2013/0016463 A1* | 1/2013 | Hiramoto et al. ........ 361/679.01 |
| 2013/0043779 A1 | 2/2013 | Fan |
| 2013/0050917 A1* | 2/2013 | Chuang et al. .......... 361/679.01 |
| 2013/0188300 A1* | 7/2013 | Schrock et al. .......... 361/679.01 |
| 2014/0097320 A1* | 4/2014 | Rizk et al. .................. 248/475.1 |

FOREIGN PATENT DOCUMENTS

| | | |
|---|---|---|
| EP | 2124129 A2 | 11/2009 |
| EP | 2431230 A1 | 3/2012 |
| FR | 2921315 | 3/2009 |
| KR | 100895585 | 4/2009 |
| WO | 2009127439 A2 | 10/2009 |
| WO | 2009143969 A1 | 12/2009 |
| WO | 2010018011 A1 | 2/2010 |
| WO | 2011047984 A2 | 4/2011 |
| WO | 2011060963 A1 | 5/2011 |

OTHER PUBLICATIONS

"In-Car Mobile Mounting Brackets, Chargers and Ruggedised Technology Cases," ace, Nemesis GB Ltd., 4 pages, dated Jul. 17, 2012.

"Galaxy S III Charting Dock," iBolt.co, http://ibolt.com, 2 pages, Copyright 2012 iBolt.co.

* cited by examiner

PORTABLE DEVICE HOLDING APPARATUS

FIELD OF THE INVENTION

The present invention generally relates to portable device holders, and more particularly relates to a portable device holder adapted to be used within a vehicle.

BACKGROUND OF THE INVENTION

Portable devices are widely used and becoming commonplace in a variety of settings. One particular setting involves the use of such devices inside a traveling vehicle to assist in and enhance a trip experience. Popular devices often include navigation units and cellular devices. In order to communicate with a vehicle's electrical system, devices of this sort are typically plugged into a vehicle's preexisting power supply input such as a cigarette lighter or auxiliary port and are mounted to an interior structure such as an inner windshield, a dashboard, or an instrument panel. In some instances, these types of mounting schemes are not only unsightly, but also result in the presence of loose cables and obstructions. Consequently, an occupant may be prevented from accessing other vehicle features and devices that may be necessary during certain circumstances. For these types of scenarios, it may be desirable to provide a portable device holder that better compliments a vehicle's spatial interior relative to the location of the user and other accessible features and devices within the vehicle.

SUMMARY OF THE INVENTION

According to one aspect of the present invention, an apparatus for holding a portable device is provided. The apparatus includes a cradle for holding a portable device and a support member operably coupled to the cradle. The support member comprises an inserting member that may be received by a receiving member. The receiving member is coupled to a base member, wherein the base member is joined to a surface. Once the receiving member receives the inserting member, a locking mechanism releasably couples the support member to the base member thereby securing the apparatus to the surface.

According to another aspect of the present invention, a method for holding a portable device on a selected surface is provided. The method includes aligning at least one of a first electrical connector disposed on a base member to at least one of a second electrical connector disposed on a support member, pressing on at least one of a locking mechanism, inserting an inserting member disposed on the support member into a receiving member disposed on the base member to make an electrical connection between the at least one of the first electrical connector and the at least one of the second electrical connector, releasing the at least one of the locking mechanism to releasably couple the support member to the base member, and securing the portable device to a cradle, wherein the cradle is operably coupled to the support member.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein. However, it is to be understood that the disclosed embodiments are merely exemplary of the invention that may be embodied in various and alternative forms. The figures are not necessarily to a detailed design and some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
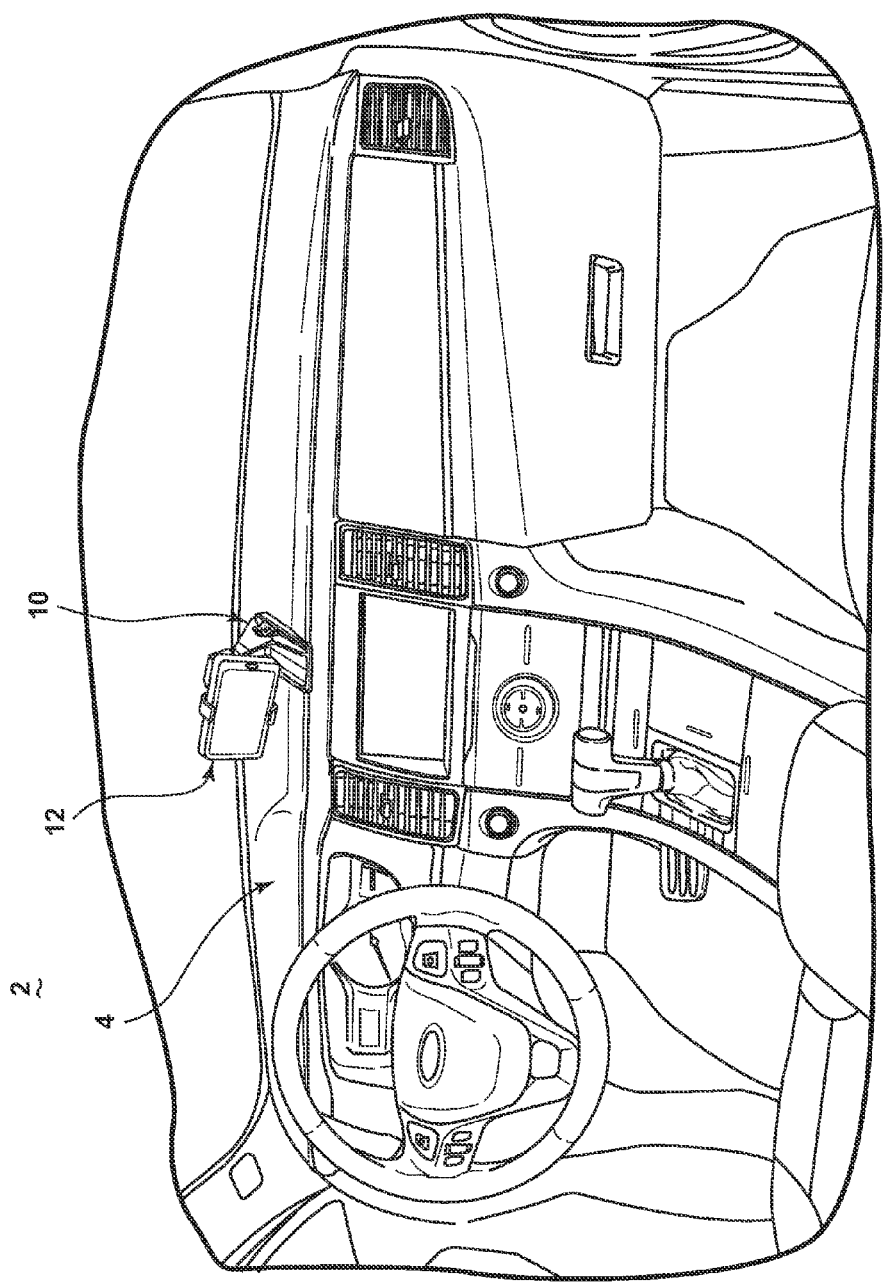
FIG. 1 is a perspective view of a vehicle passenger compartment having a dashboard employing a portable device holding apparatus.

Referring now to FIG. 1, a passenger compartment 2 of an automotive vehicle is generally illustrated having a dashboard 4 generally located below the front windshield and in front of the driver and front passenger seats. The dashboard 4 may include various components such as one or more instrument and display panels, user input switches, storage compartments, and other vehicle assemblies for occupant use and enjoyment. The dashboard 4 is equipped with a portable device holding apparatus 10 generally positioned on a surface of the dashboard 4 to be accessible by the driver and front passenger. As further illustrated in FIG. 1, a generic portable device 12 is secured by the portable device holder 10 and oriented to face the driver so as to provide easy viewing of the display screen.

Figure 2:
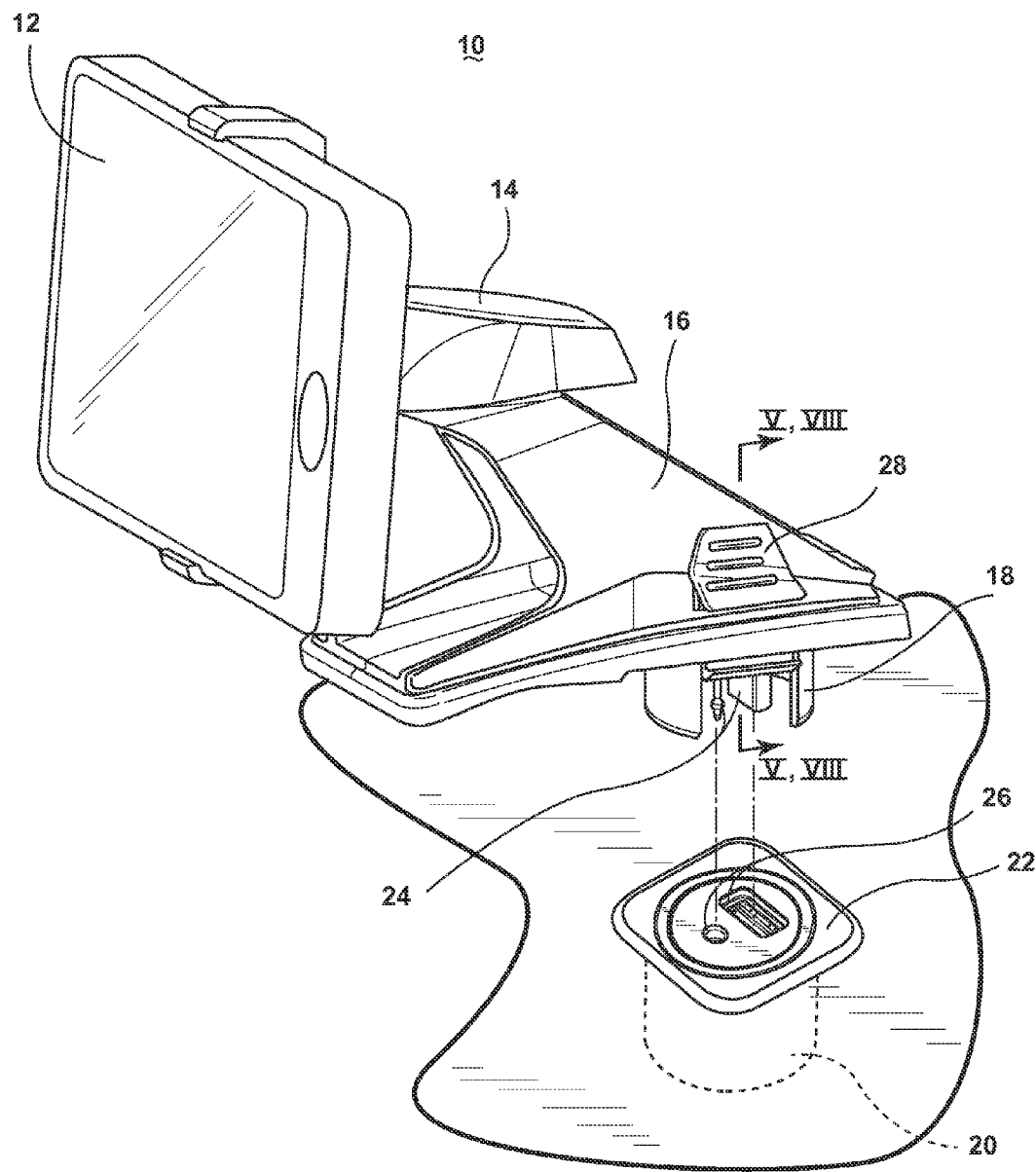
FIG. 2 is perspective side view of one general embodiment of the portable device holding apparatus.

Referring now to FIG. 2, one general embodiment of the portable device holding apparatus 10 is shown and includes a cradle 14 for holding the portable device 12. The cradle 14 includes a support member 16 that has an inserting member 18 configured to be received by a receiving member 20, wherein the receiving member 20 is coupled to a base member 22. The base member 22 may additionally include one or more first electrical connectors 24 adapted to make electrical connections with one or more second electrical connectors 26 disposed on the support member such that the first and second electrical connectors 24, 26 are electrically coupled when the inserting member 18 has been properly aligned and inserted into the receiving member 20. Once the inserting member 18 has been received by the receiving member 20, a releasable locking mechanism 28 may temporarily affix the support member 16 to the base member 22 until a user no longer desires to use the portable device holding apparatus 10. In that instance, the user may release the releasable locking mechanism 28 and remove the inserting member 18 from the receiving member 20. The support member 16 may in turn be stored in any desirable location until further use is desired.

Figure 3:
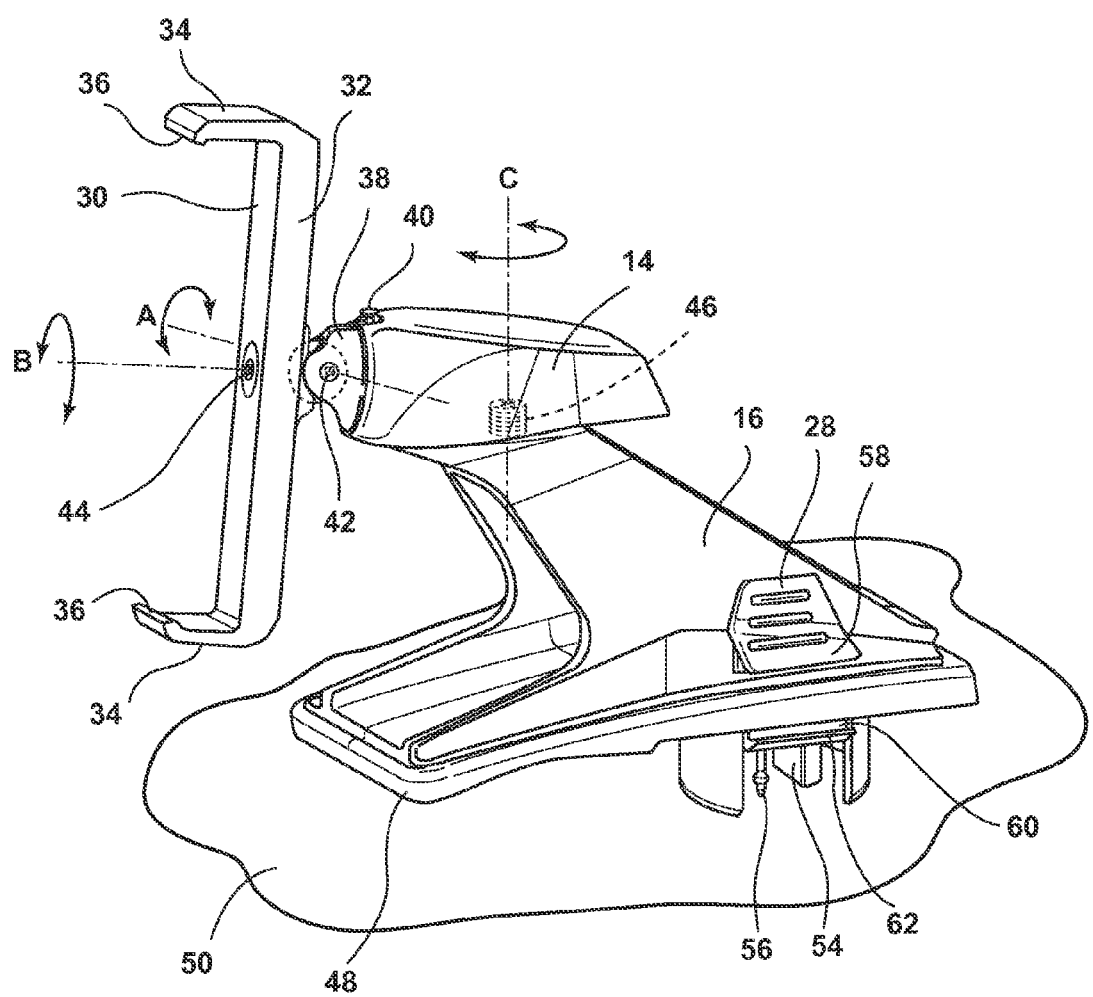
FIG. 3 is a perspective side view of one exemplary embodiment of a cradle and support member assembly.

Referring now to FIG. 3, an exemplary embodiment of the cradle 14 is shown, wherein the cradle 14 further includes a claw 30 having a support 32 and an arm 34 that extends perpendicularly from each end of the support 32 and outwardly with respect to the support member 16. Additionally, each arm 34 is substantially parallel in relation to the other and includes an inward facing grip 36. In this arrangement, a corresponding portable device can be inserted between each arm 34 from either side of the cradle 14 and guided to the desired position. If the cradle 14 is constructed from a flexible material, the portable device can also be snapped in place by gently pushing the portable device towards the support 32. Regardless of attachment method, once the desired position has been reached, the holding forces of the claw 30 will prevent additional movement of the portable device absent any user intervention.

Since portable devices are not always rectangular in shape, the portable device holding apparatus 10 can be optionally configured to hold devices of different shapes and sizes. As seen in FIG. 3, the claw 30 is mated to a joint 38 that is removably coupled to the cradle 14, wherein the joint 38 and claw 30 assembly can be easily removed via a releasable locking clip 40 and substituted with another joint and claw assembly that is configured to hold a portable device having a different size and shape. Alternatively, the joint 38 may be fixed to the cradle 14 thus requiring the claw 30 to be adjustable so that portable devices of different sizes and shapes can be easily accommodated without the removal of cradle 14 components. Given the numerous types of portable devices in use, the dimensions of claw 30 will necessarily depend on the shape, width, and depth of the portable device being held and should be adapted to ensure a snug fit so that the portable device holding apparatus 10 can withstand dynamic forces including common vehicular occurrences such as sudden movement or disturbances caused by sharp turning maneuvers or bumps on the road.

Referring again to the present embodiment, the cradle 14 is pivotally coupled to the support member 16 to enable a user to control the pitch (fore and aft tilt) about a pitch axis A, the roll (side to side tilt) about a roll axis B, and the yaw (rotation about a vertical axis) about a yaw axis C of the cradle 14 so that a portable device may be easily viewed in a plurality of orientations. As will be obvious to those skilled in the art, many suitable adaptations exist for achieving the described pivotal relationship between the cradle 14 and the support member 16. With respect to the instant embodiment, the joint 38 makes a swiveled connection with the claw 30 via a first locking screw 42 to enable a user to pivot the claw 30 about the pitch axis A. As a result, users of different heights can alter the pitch of the portable device to achieve a desirable vantage point. To do so, a user need simply apply the required directional force to overcome the holding force present in the first locking screw 42. Similarly, a second locking screw 44 is pivotally coupled to the claw 30 to enable a user to pivot the claw 30 about the roll axis B. Consequently, a user may view the portable device in various popular orientations such as landscape and portrait style by simply turning the device on the cradle 14 to the desired position. The cradle 14 further includes a third locking screw 46 pivotally coupled to the support member 16 so that a user may pivot the cradle 14 about the yaw axis C to enable a plurality of passengers to use and access the portable device. The first, second, and third locking screws 42, 44, and 46 are independently adjustable by a user to loosen to allow rotation and to tighten to lock the cradle 14 in place.

Figure 4:
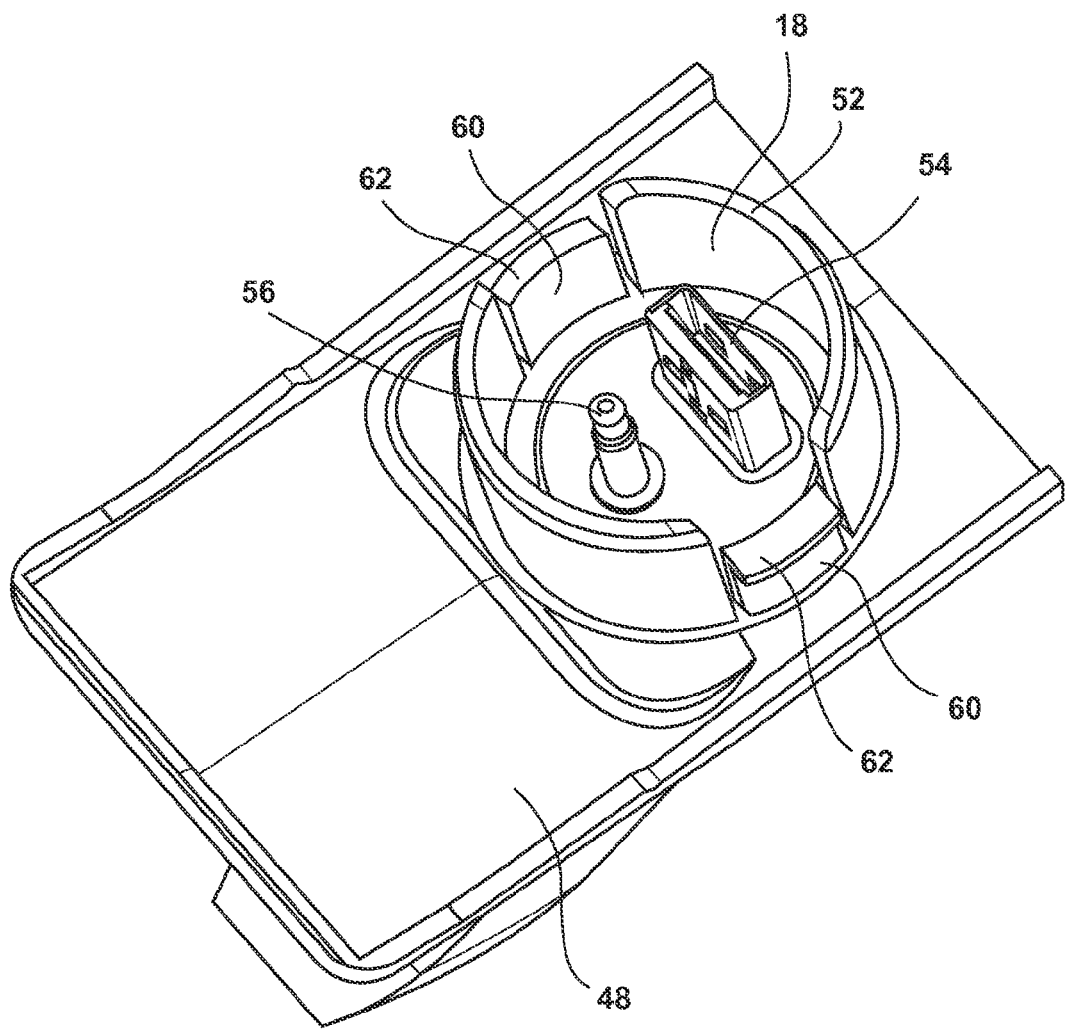
FIG. 4 is a perspective bottom view of one exemplary embodiment of the support member.

The support member 16 of the cradle 14 can take on a variety of structural shapes for support and aesthetic purposes and can be adapted to any suitable mounting surface. Since some surfaces may be non-linear, additional consideration can be given for adapting the support member 16 to engage surfaces of these types. With particular reference to FIGS. 3 and 4, the support member 16 includes a base 48 contoured to a non-linear surface 50 such as a vehicle dashboard. The inserting member 18 is disposed on the underside of the support member 16 and includes a cylindrical extension 52 having an open distal end and two opposite spaces formed in the wall of the cylindrical extension 52. The second electrical connectors 24 include a USB plug 54 and an auxiliary plug 56 coupled to the underside of the support member 16 and disposed within the inserting member 18 to face the open distal end. Additionally, the releasable locking mechanism 28 is disposed on two opposite sides of the support member 16 and configured to extend through the underside of the support member 16. With respect to the present embodiment, each releasable locking mechanism 28 includes a pressable portion 58 coupled to a clipping portion 60, wherein each clipping portion 60 also includes a distal projection 62 that is disposed to face away from the opposing releasable locking mechanism 28. Regarding the present embodiment, each pressable portion 58 is integrated with the base 48 of the support member 16 and each clipping portion 60 is disposed within one of the opposite spaces in the wall of the cylindrical extension 52. Depending on whether or not a user has engaged the releasable locking mechanism, the pressable portion 58 and clipping portion 60 of each releasable locking mechanism 28 are configured to move in concert between a locked position and an unlocked position.

Figure 5:
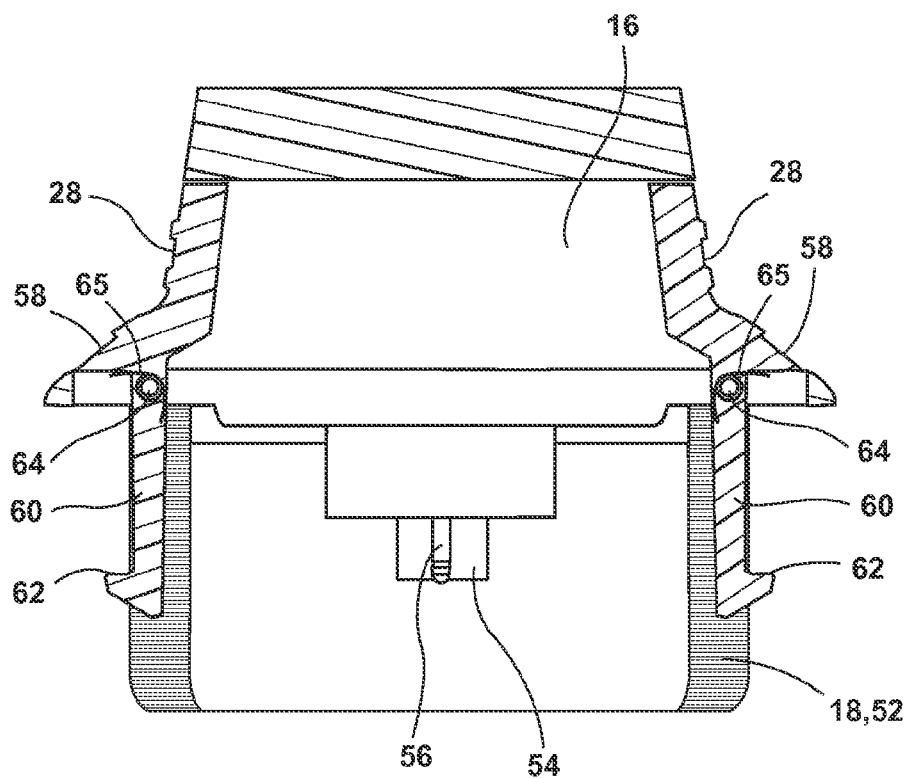
FIG. 5 is a cross-sectional front view of the portable device holding apparatus taken through V-V of FIG. 2 showing a locking mechanism in a locked position.
Figure 6:
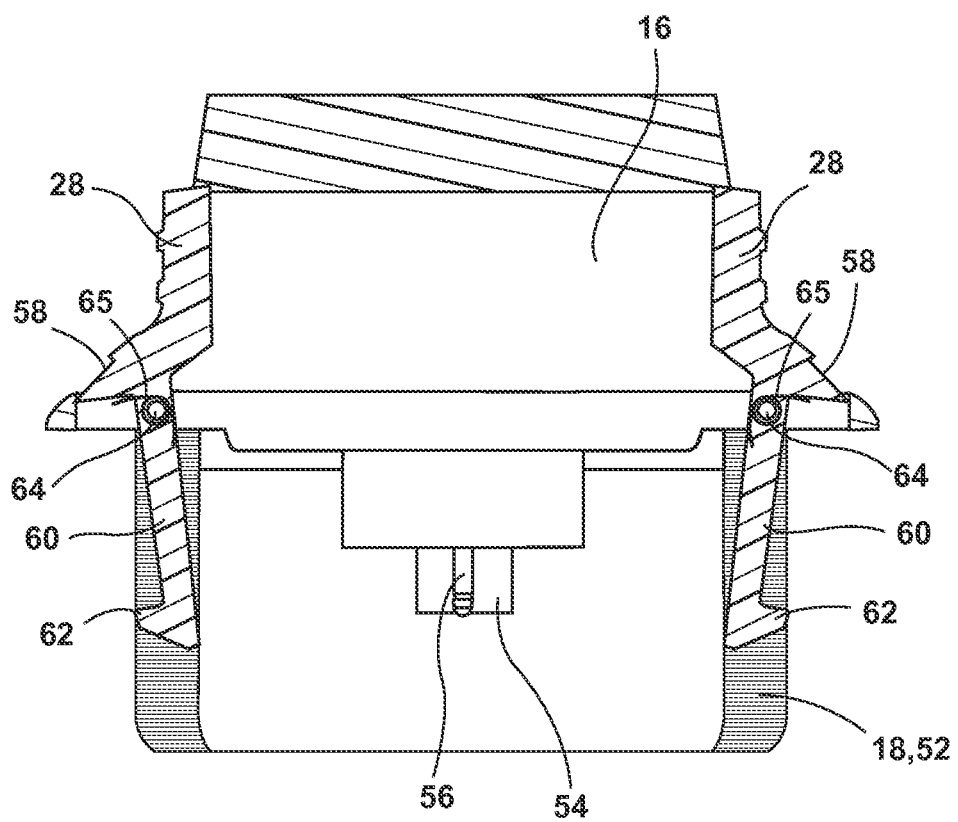
FIG. 6 is a cross-sectional front view of the portable device holding apparatus taken through V-V of FIG. 2 showing the locking mechanism in an unlocked position.

With particular reference to FIGS. 5 and 6, a cross-sectional view of the support member 16 is shown, wherein a pivot pin 64 pivotally couples each releasable locking mechanism 28 to the support member 16 and a torsion spring 65 biases each releasable locking mechanism 28 in favor of the locked position. In FIG. 5, each releasable locking mechanism 28 is shown in the locked position, wherein each releasable locking mechanism 28 is substantially vertical and each distal projection 62 extends beyond the wall of the cylindrical extension 52. In FIG. 6, the releasable locking mechanism 28 is shown in the unlocked position, wherein a user has applied inward pressure to each pressable portion 58 causing each torsion spring 65 to compress to allow each clipping portion 60 to tilt inwards such that each distal projection 62 no longer extends beyond the wall of the cylindrical extension 52. Upon release of each pressable portion 58, the spring bias will subsequently return the releasable locking mechanism to the locked position.

Figure 7:
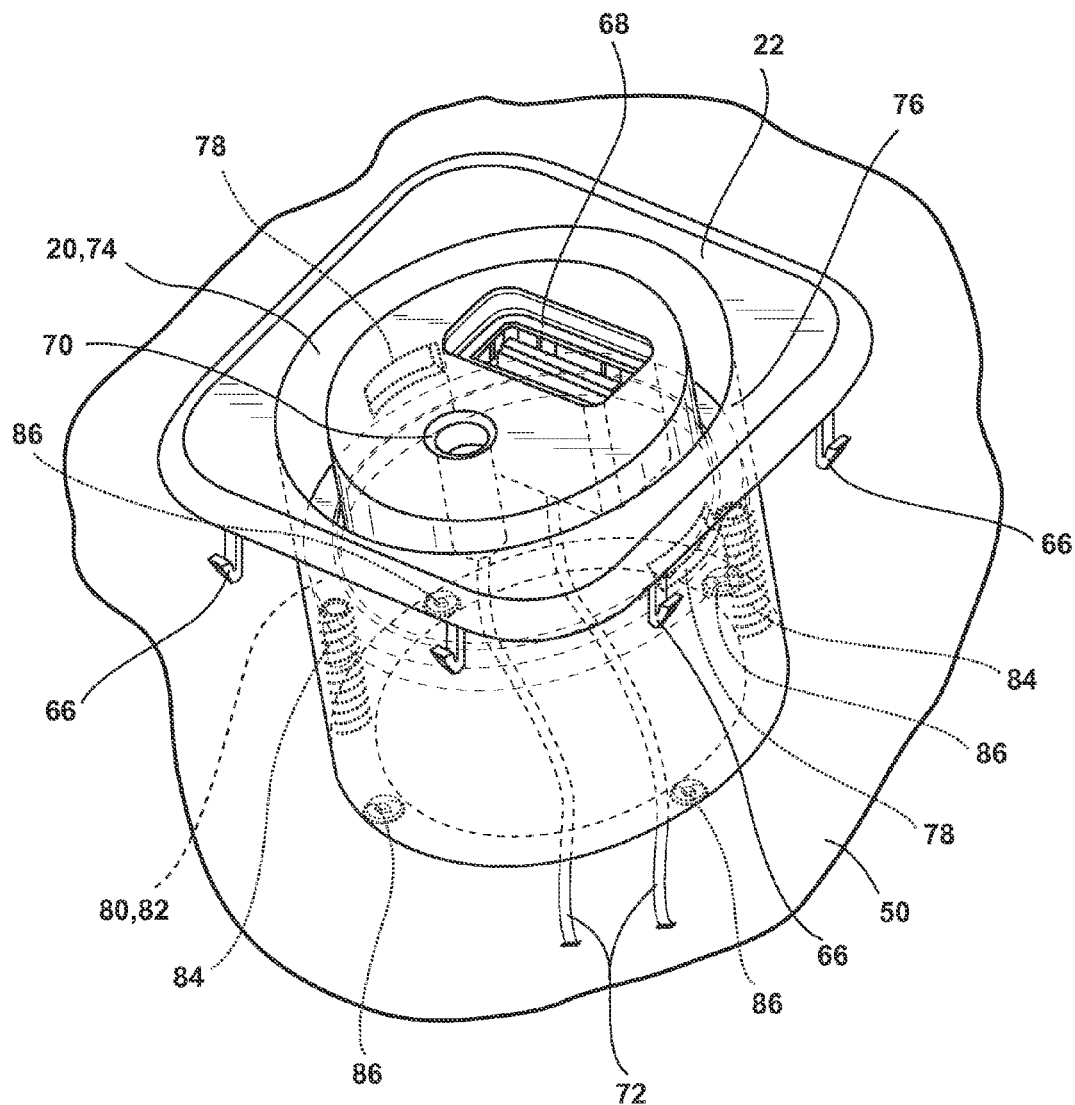
FIG. 7 is a perspective elevation view of one exemplary embodiment of the base member.

Referring now to FIG. 7, one exemplary embodiment of the base member 22 is shown, wherein the base member 22 can be contoured and integrated with any suitable surface via a plurality of mounting clips 66. The first electrical connectors 26 are disposed centrally on the base member 22 and comprise a USB port 68 and an auxiliary port 70 disposed to receive the USB plug 54 and auxiliary plug 56 of the previous embodiment, wherein the USB port 68 and auxiliary port 70 are configured to communicate electrically with an electrical source, such as the electrical system of a vehicle, via a pair of electrical wires 72. The receiving member 20 is disposed to enclose the USB port 68 and the auxiliary port 70, wherein the receiving member 20 comprises a receptacle 74 contoured to the cylindrical extension 52 as shown in the previous embodiment. As shown in FIG. 7, the receptacle 74 includes an annular depression 76 and two oppositely disposed notches 78 on the outer ringed wall of the receptacle 74, wherein the two notches are each configured to engage one of distal projections 62 as shown in the previous embodiment.

As an optional feature, the receiving member 20 may additional include a guarding member 80 for deterring unwanted materials from entering the receptacle 74 when the inserting member 18 has not yet been received. In the present embodiment, the guarding member 80 comprises a movable ring 82 that is concentric with the receptacle 74 and is disposed to move within the receptacle between a first position that is substantially near the annular entrance of the receptacle 74, and a second position that is at a predetermined distance below the receptacle 74 entrance. Additionally, the movable ring 82 is operably coupled to two springs 84 disposed longitudinally within the receptacle 74 having a spring bias towards the first position. In this arrangement, when the receiving member 20 has not yet received the inserting member 18, the two springs 84 naturally hold the movable ring 82 in the first position to prevent unwanted materials from entering the receptacle 74. Conversely, the receiving member 20 receives the inserting member 18, the movable ring 82 is depressed towards the second position so as not to obstruct the receival of the inserting member 18. If the movable ring 82 is made from a translucent material, one or more user-activated lighting assemblies 86 that are electrically coupled to the electrical source can be disposed near the bottom of the receptacle 74 to provide a desirable lighting effect that is viewable when the movable ring 82 is in the first position.

Figure 8:
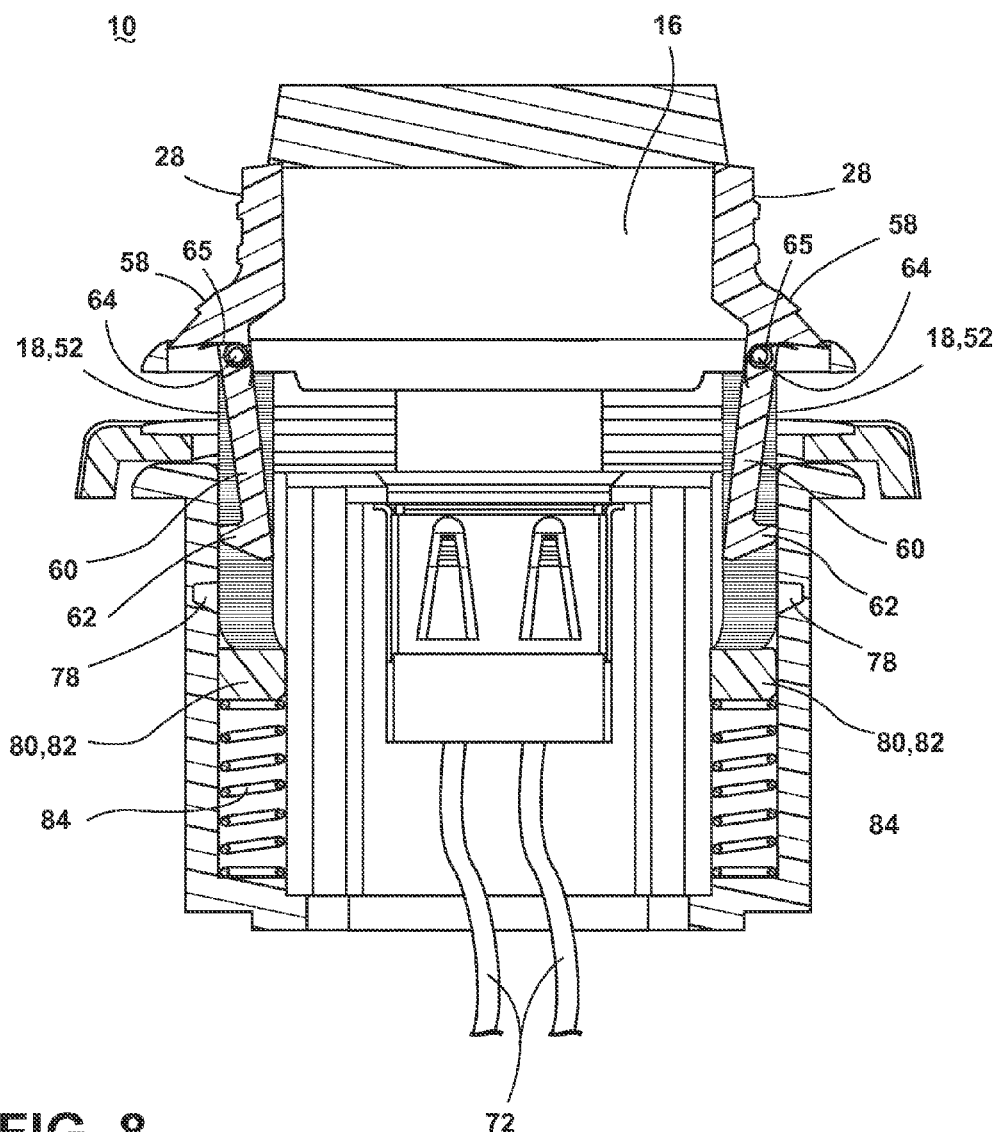
FIG. 8 is a perspective front view of the portable device holding apparatus taken through VIII-VIII of FIG. 2 showing an inserting member being received by a receiving member.
Figure 9:
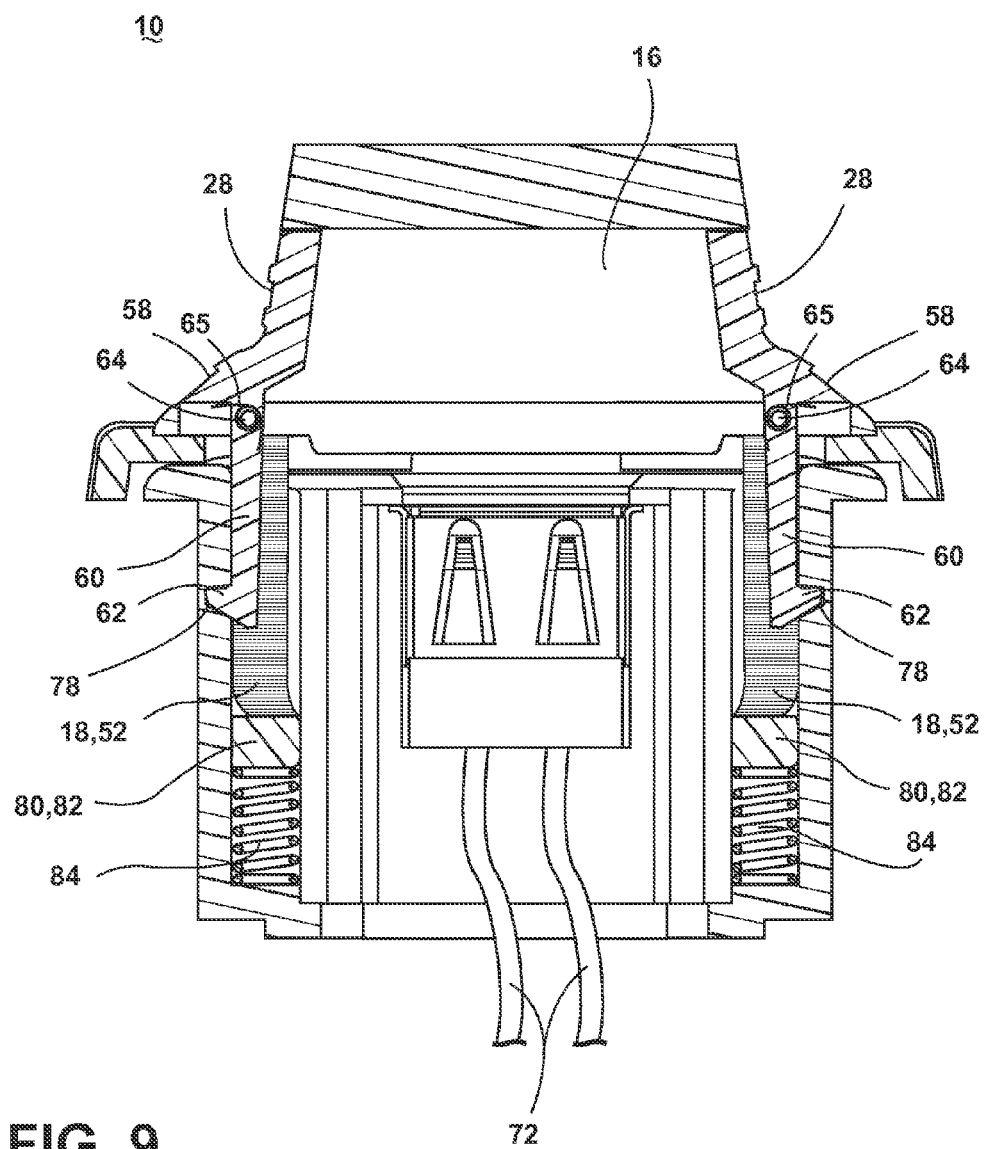
FIG. 9 is a perspective front view of the portable device holding apparatus taken through VIII-VIII of FIG. 2 showing the locking mechanism locking the support member to the base member once the inserting member has been fully received by the receiving member.

In operation, once the USB plug 54 and auxiliary plug 56 have been aligned with the USB port 68 and the auxiliary port 70, a user may press each pressable portion 58 of the locking mechanism 28 (thereby retracting each distal projection 62) to the unlocked position so that the cylindrical extension 52 can be properly received by the receptacle 74 (see FIG. 8). As the cylindrical extension 52 travels downward within the receptacle 74, the cylindrical extension 52 contacts and depresses the movable ring 82 towards the second position. Once the cylindrical extension 52 has been fully received, the user may release each pressable portion 58 to return the releasable locking mechanism 28 to the locked position, thereby coupling each distal projection 62 with each notch 78 to secure the apparatus 10 to a supporting surface (see FIG. 9). Concurrently, an electrical connection is made between the USB plug 54 and USB port 68 and between the auxiliary plug 56 and auxiliary port 70 to enable electrical communication with the electrical source. As a result, it is conceivable that other port or plug arrangements may be disposed on the support member 16 and cradle 16 assembly to enable a portable electronic device being held to engage in communications with the electrical source such as receiving electrical power. When the user no longer desires to use the apparatus 10, the user may again press each releasable locking mechanism 28 to the unlocked position and remove the cylindrical extension 52 accordingly, which also terminates the electrical connection between the USB plug 54 and USB port 68 and between the auxiliary plug 56 and the auxiliary port 70. As a result the movable ring 82 will return to the up position and the user can enjoy the lighting effect produced on the movable ring 82. The support member and cradle assembly can subsequently be stored until the next use. For instances where a user does not require a portable device to be held, the support member 16 and cradle 14 assembly may be left in storage and a compatible portable device can be directly connected to the USB port 68 or the auxiliary port 70 on the base member 22 to communicate with the electrical source.

Accordingly, the portable device holding apparatus 10 described advantageously holds a portable device for convenient viewing and use within a vehicle. The apparatus 10 is stowable and readily assembled to accommodate the positioning of various portable devices.

It is to be understood that variations and modifications can be made on the aforementioned structures without departing from the concepts of the present invention, and further it is to be understood that such concepts are intended to be covered by the following claims unless these claims by their language expressly state otherwise.

What is claimed is:

1. A portable device holder, comprising:
  a cradle for holding a portable device and having an inserting member;
  a receiving member that at least partially extends into a supporting surface for receiving the inserting member therein;
  a pressable locking mechanism for releasably coupling the inserting member to the receiving member; and
  a guarding member that is movable within the receiving member and is biased to a position that blocks entry into the receiving member whenever the receiving member is free of the inserting member.

2. The portable device holder of claim 1, wherein the inserting member is downwardly received by the receiving member.

3. The portable device holder of claim 1, wherein pressing the locking mechanism allows for the inserting member to be inserted into the receiving member, and wherein releasing the locking mechanism locks the inserting member to the receiving member.

4. The portable device holder of claim 1, wherein the guarding member depresses to allow insertion of the inserting member into the receiving member.

5. The portable device holder of claim 1, wherein the guarding member is spring biased.

6. The portable device holder of claim 1, wherein the guarding member is translucent and illuminates when in the biased position.

7. The portable device holder of claim 6, wherein illumination of the guarding member is provided by one or more lighting assemblies disposed inside the receiving member.

8. The portable device holder of claim 1, wherein the supporting surface is provided inside a vehicle.

9. The portable device holder of claim 1, configured to provide electrical power to the portable device when the inserting member is received in the receiving member.

10. A portable device holder comprising:
  a cradle for holding a portable device and having:
    an inserting member; and
    a pressable locking mechanism;
  a receiving member coupled to a supporting surface and configured to receive the inserting member therein; and a guarding member that is movable within the receiving member and is biased to a position that blocks entry into the receiving member whenever the receiving member is free of the inserting member;

wherein pressing the locking mechanism allows for the inserting member to be inserted into the receiving member; and wherein releasing the locking mechanism locks the inserting member to the receiving member.

11. The portable device holder of claim 10, wherein the inserting member is downwardly received by the receiving member.

12. The portable device holder of claim 10, wherein the receiving member includes a receptacle having an annular depression and the inserting member is configured to be received in at least a portion of the annular depression.

13. The portable device holder of claim 10, wherein the guarding member depresses to allow insertion of the inserting member into the receiving member.

14. The portable device holder of claim 10, wherein the guarding member is spring biased.

15. The portable device holder of claim 10, wherein the guarding member is translucent and illuminates when in the biased position.

16. The portable device holder of claim 15, wherein illumination of the guarding member is provided by one or more lighting assemblies disposed inside the receiving member.

17. The portable device holder of claim 10, wherein the supporting surface is provided inside a vehicle.

18. The portable device holder of claim 10, configured to provide electrical power to the portable device when the inserting member is received in the receiving member.

19. A portable device holder, comprising:

a cradle for holding a portable device and having an inserting member;

a receiving member coupled to a supporting surface for receiving the inserting member;

a locking mechanism for releasably coupling the inserting member to the receiving member; and a guarding member movable within the receiving member and biased to a position blocking entry into the receiving member whenever the receiving member is free of the inserting member.

* * * * *